United States Patent
Hedenig et al.

(10) Patent No.: US 9,748,140 B1
(45) Date of Patent: Aug. 29, 2017

(54) METHOD OF MANUFACTURING SEMICONDUCTOR DEVICES

(71) Applicant: Infineon Technologies AG, Neubiberg (DE)

(72) Inventors: Ursula Hedenig, Villach (AT); Markus Ottowitz, Arnoldstein (AT); Thomas Grille, Villach (AT); Carsten von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 18 days.

(21) Appl. No.: 15/154,677

(22) Filed: May 13, 2016

(51) Int. Cl.
*H01L 21/00* (2006.01)
*H01L 21/78* (2006.01)
*H01L 21/687* (2006.01)
*H01L 21/033* (2006.01)
*H01L 21/67* (2006.01)

(52) U.S. Cl.
CPC ............ *H01L 21/78* (2013.01); *H01L 21/033* (2013.01); *H01L 21/67115* (2013.01); *H01L 21/68785* (2013.01)

(58) Field of Classification Search
None
See application file for complete search history.

(56) References Cited

U.S. PATENT DOCUMENTS

| | | | | |
|---|---|---|---|---|
| 2008/0242052 A1* | 10/2008 | Feng | ................... | H01L 21/3043 438/459 |
| 2010/0108254 A1* | 5/2010 | Huff | ......................... | C22C 1/00 156/281 |
| 2014/0106649 A1* | 4/2014 | Kim | .................... | H01L 21/6835 451/54 |
| 2014/0242756 A1* | 8/2014 | Xue | ........................ | H01L 21/78 438/113 |
| 2016/0155656 A1* | 6/2016 | Matsumura | ............. | H01L 21/78 438/464 |

\* cited by examiner

*Primary Examiner* — Angel Roman
(74) *Attorney, Agent, or Firm* — Dicke, Billig & Czaja, PLLC

(57) ABSTRACT

A method for use in manufacturing semiconductor devices includes providing a wafer on a support, covering a central wafer portion of the wafer, and cutting a marginal wafer portion of the wafer from the wafer. According to an embodiment of an apparatus, the apparatus includes a support configured to support a wafer, a masking device configured to cover a central wafer portion of the wafer, and a cutting device configured to cut a marginal wafer portion of the wafer from the wafer.

15 Claims, 3 Drawing Sheets

METHOD OF MANUFACTURING SEMICONDUCTOR DEVICES

FIELD OF TECHNOLOGY

The present application relates to a method of manufacturing semiconductor devices.

BACKGROUND

Semiconductor devices such as Micro-Electro-Mechanical Systems (MEMS) are manufactured on wafers that provide a semiconductor substrate for the semiconductor device. A diameter of the wafer can be equal to or greater than 300 mm. A thickness of the wafer can be less than 300 μm. Such a wafer can easily break. In order to strengthen the wafer against breakage, the wafer can be provided with a so-called Taiko ring that has a larger thickness than a central portion of the semiconductor wafer where the semiconductor devices are manufactured. The Taiko ring surrounds the central portion of the semiconductor wafer and reduces a risk of breakage of the semiconductor wafer.

At some stage in the manufacturing process, the Taiko ring has to be removed. Cutting the Taiko ring from the central portion of the wafer releases particles. Some of the particles can settle on a surface of the wafer where the particles can act as an impurity that compromises functionality of the semiconductor devices on the wafer. For example, an acoustic sensor requires a cavity for a movable microphone membrane. Impurity particles that settle within the cavity can affect how the microphone membrane moves thereby altering a response of the acoustic sensor to pressure waves that hit the microphone membrane.

SUMMARY

According to an embodiment of a method, the method includes providing a wafer on a support, covering a central wafer portion of the wafer, and cutting a marginal wafer portion of the wafer from the wafer.

According to an embodiment of an apparatus, the apparatus includes a support configured to support a wafer, a masking device configured to cover a central wafer portion of the wafer, and a cutting device configured to cut a marginal wafer portion of the wafer from the wafer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
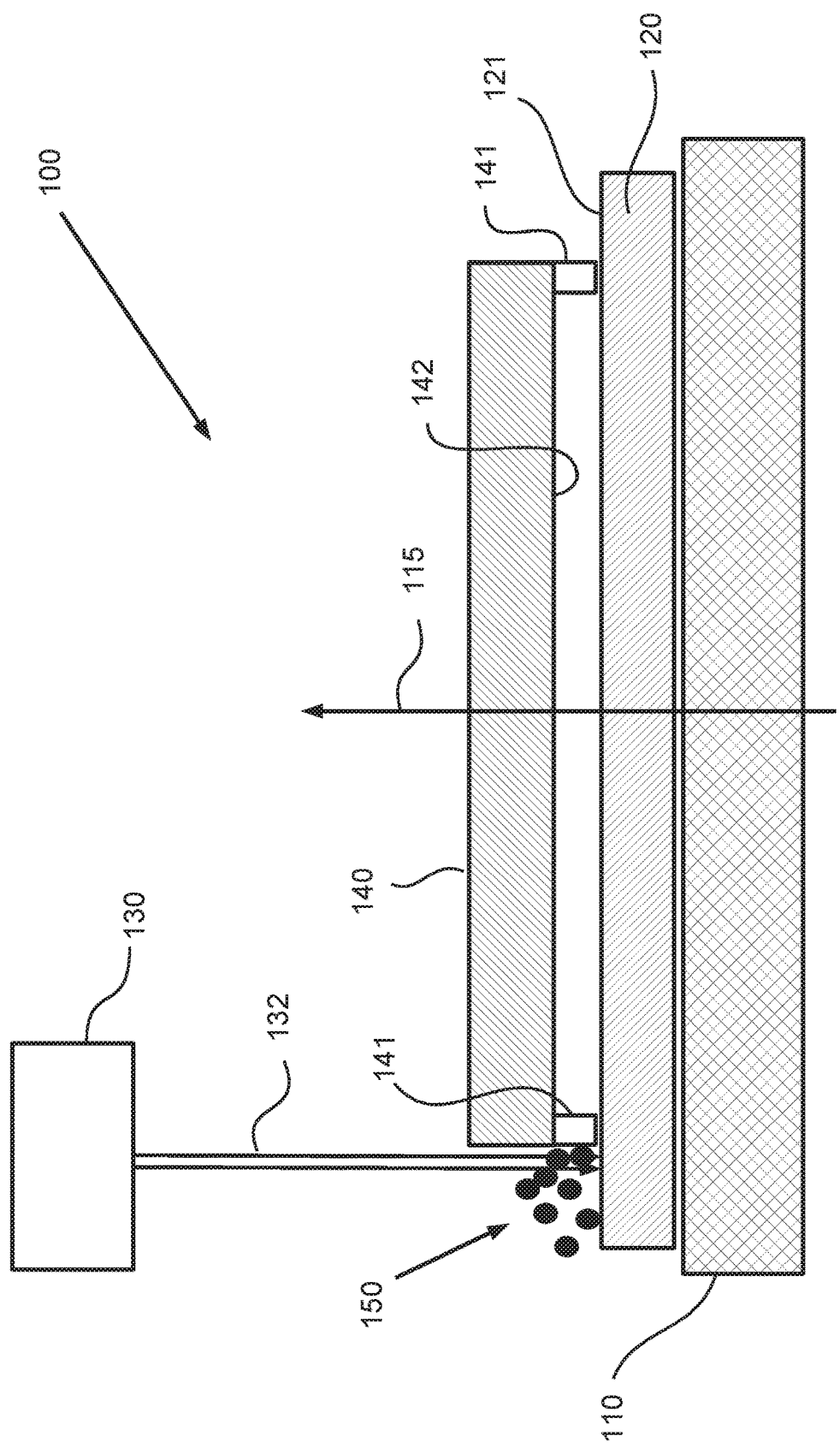
FIG. 1 illustrates a sectional side view of an embodiment of an apparatus for handling a wafer.

FIG. 1 illustrates a sectional side view of an embodiment of an apparatus 100 for handling a workpiece such as a wafer 120. The apparatus 100 is configured as a tool for use in manufacturing semiconductor devices. Embodiments of semiconductor devices or semiconductor device chips, on the one hand, can include integrated circuits that have many transistors, e.g., thousands or millions, interconnected to form any number of devices such as processors, controllers or any other suitable type of devices. On the other hand, semiconductor devices can include embodiments that have only a single transistor, e.g., a power MOSFET. The device in other embodiments does not include any transistors (e.g., a MEMS device).

The apparatus 100 includes a support provided as a chuck 110 that is configured to support a workpiece, for example, a wafer 120. The apparatus 100 includes a cutting device provided as a laser tool 130 that is configured to emit a laser beam 132. Further, in accordance with the various embodiments disclosed herein, the apparatus 100 includes a masking device 140 that is illustrated as a cover plate 140 that is configured to cover at least a portion of wafer 120.

In the illustrated embodiment, chuck 110 can include a chuck base, a turntable, and a bearing configured to support the turntable on the chuck base (not illustrated). In some embodiments, the apparatus 100 includes a drive unit (not illustrated). In some embodiments, the drive unit is configured to receive a control signal and, based on the control signal, to move the turntable. In some embodiments, the turntable is provided with the drive unit being configured to rotate the turntable relative to the chuck base of chuck 110 about an axis of rotation 115 that, in some embodiments, is essentially vertical. In some embodiments, the drive unit is configured to laterally move the turntable relative to the chuck base of chuck 110.

In some embodiments, chuck 110 and laser tool 130 are arranged so as to enable a rotation of wafer 120 with respect to laser beam 132. Thus, wafer 120 supported by chuck 110 can rotate together with the turntable of chuck 110, so as to drive various portions of wafer 120 to a location that is exposed to laser beam 132. In another embodiment, the chuck is fixed and a direction of laser beam 132 can be varied. Thus, laser beam 132 can be directed to various portions of wafer 120 to be exposed to laser beam 132. In one embodiment, wafer 120 is supported by chuck 110 and laser beam 132 can be directed onto a surface 121 of wafer 120 in order to cut wafer 120.

In some embodiments, masking device 140 is provided with sufficient stiffness for a gap between surface 121 of wafer 120 and a face 142 of masking device 140 to be essentially the same throughout a central portion of wafer 120. In one embodiment, the central portion of wafer 120 is the portion of wafer 120 that is under the masking device 140. For example, in some embodiments, masking device 140 can be provided as cover plate 140 and be formed from a material such as a metal or an alloy such as steel. In some embodiments, cover plate 140 is made from plastic. Given a typical wafer 120 to be handled by apparatus 100, a stiffness of cover plate 140, in some embodiments, is greater than a stiffness of wafer 120 in the (thinned) central portion of wafer 120. In some embodiments, a contour of mask plate 140 follows a circumferential contour of a step (not illustrated) formed where the central wafer portion abuts the marginal wafer portion. In one embodiment, the marginal wafer portion of wafer 120 is the portion of wafer 120 that is not under masking device 140. In some embodiments, masking device 140 is configured to be spaced apart from surface 121 of wafer 120 while covering the central portion of wafer 120.

In some embodiments, the apparatus is provided with at least one opening (not shown), for example in the cover plate 140, configured as a duct to direct a gas and/or a fluid from a reservoir or other source (not shown) into the space between the cover plate 140 and the surface 121 of wafer 120. In one embodiment, the gas is blown into the space between masking device 140 and wafer 120 in order to provide a pressure at surface 121 of wafer 120 that is greater than an ambient pressure. In one embodiment, particles 150 act as impurities that are kept away or driven away from the central portion of wafer 120 prior to attachment to surface 121 of wafer 120.

In some embodiments, fins 141 are attached to cover plate 140 that provide a collar that extends downwards from cover plate 140 towards chuck 110. Fins 141 can be formed from a soft material. In some embodiments, fins 141 are substantially made from or include a substance such as silicone. In some embodiments, fins 141 extend downwards and contact surface 121 of wafer 120 in the marginal portion of wafer 120. In the illustrated embodiments, the marginal portion, herein also referred to as the edge portion of wafer 120, is less sensitive to exposure to other substances than the central portion of wafer 120 as the edge portion includes the Taiko ring whereas the central portion of wafer 120 includes the device(s) to be manufactured. In some embodiments, fins 141 reduce or close gaps that particles 150 could otherwise use to enter the space between wafer 120 and cover plate 140. The particles 150 can adversely act as impurities that settle on surface 121 of wafer 120 and impair the functionality or reliability of devices that are manufactured on a substrate of wafer 120.

Figure 2:
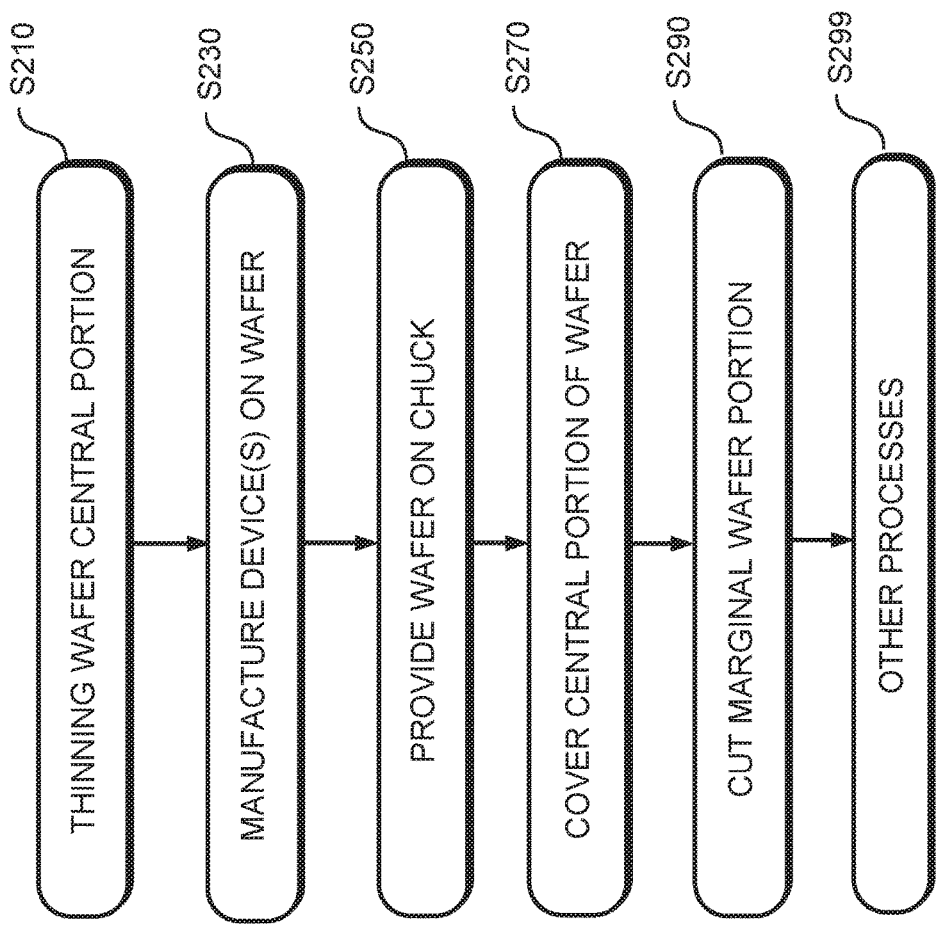
FIG. 2 illustrates a flowchart of an embodiment of a method of manufacturing semiconductor devices.

FIG. 2 illustrates a flowchart of an embodiment of a method of manufacturing semiconductor devices. While reference will be made to the exemplary embodiment of apparatus 100 illustrated in FIG. 1, it should be understood that variants of apparatus 100 in other embodiments can be used without deviating from the concepts as defined herein.

At S210, in some embodiments, a central wafer portion of wafer 120 is thinned. In these embodiments, the central wafer portion of wafer 120 is thinner than a peripheral portion of wafer 120. The central wafer portion of wafer 120 can be provided to form a die or dies that have a thin substrate. In some embodiments, the central portion of wafer 120 may not have any devices to be manufactured. In some embodiments, the substrate in the central portion of wafer 120 is of an essentially homogeneous thickness. As used herein, the wording "homogenous" includes embodiments where devices are formed on the substrate, whereby the substrate is provided with a topology. In some embodiments, the central wafer portion of wafer 120 is thin and wafer 120 is formed with a so-called Taiko ring that is thick in comparison with the central wafer portion. Thus, the Taiko ring can provide resistance against bending to wafer 120. At least one effect can be that, despite the fact that the central portion of wafer 120 is thin, wafer 120 is resistive to breakage.

At S230, in some embodiments, at least one semiconductor device is manufactured on a wafer such as wafer 120.

At S250, wafer 120 is provided on a support. In some embodiments, the support is provided as chuck 110 illustrated in FIG. 1. Wafer 120 is set down on chuck 110. In some embodiments, as described above, chuck 110 includes a turntable, and wafer 120 is set down on the turntable.

At S270, the central wafer portion of wafer 120 is covered by masking device 140. Covering the central wafer portion of wafer 120 includes setting a masking device 140 over the central wafer portion of wafer 120. The cover plate 140 is set or brought close to a surface 121 of wafer 120 without touching the surface 121, whereby a gap or space between masking device 140 and wafer 120 is left. For example, a crane (not illustrated) can hold cover plate 140. At least one effect can be that a distance between cover plate 140 and surface 121 of wafer 120 is sufficiently small to keep impurity particles 150 from entering a space between wafer 120 and cover plate 140. Thus, a number of impurity particles 150, for example, impurity particles 150 generated during cutting the Taiko ring from wafer 120, that settle on surface 121 in the central portion of wafer 120, can be sufficiently low so as to be acceptable.

In some embodiments, a gas is blown into the space between face 142 of cover plate 140 and surface 121 of wafer 120. In some embodiments, clean air can be used which, in a typical manufacturing environment, is in ample supply. In some embodiments, a halogen is used which has a cleaning effect on surface 121 of wafer 120. In some embodiments, a noble gas is used which is chemically inactive on surface 121 of wafer 120. In some embodiments, a combination of two or more of the above is used. In some embodiments, a fluid or a combination of gas and fluid is used. At least one effect can be that the gas and/or fluid provide a pressure in the space between cover plate 140 and wafer 120 that is larger than an ambient pressure. Therefore, particles that as impurities could cause damage to the device(s) manufactured on wafer 120 can be removed from wafer surface 121 by being transported away in a flow of the gas and/or the fluid towards the ambient air.

At S290, a marginal portion of the wafer is cut. As schematically indicated in FIG. 1, the cutting action releases particles from the wafer substrate. For example, where the laser beam 132 is used, at a location of impact on the wafer substrate, the laser beam 132 provides a certain amount of energy to a volume of the substrate. In some embodiments, an energy density in that volume can be sufficient to generate a plasma wherein some or all of the substrate particles in the volume are ionized. As a result, particles break loose from the substrate and travel away from the volume. Since the travel motion is thermal, i.e., the motion is not in any particular direction, the particles also travel in the direction of the wafer's central portion. However, with either the distance between cover plate 140 and the surface 121 of wafer 120 being small or the fins 141 essentially closing the gap between wafer 120 and cover plate 140, very few or no particles above a certain size can enter the space between cover plate 140 and wafer 120. At least one effect can be that the number of impurity particles on the wafer surface 121 becomes sufficiently small to be acceptable.

At S299, in some embodiments, other processes are performed. For example, in a case where the wafer is provided as a basis for manufacture of more than a single semiconductor device, the wafer can be subjected to dicing. Prior to dicing, in some embodiments, a foil or other carrier can be attached to the wafer. At least one effect can be that dice are held in place during dicing of the wafer. At some stage, the dice can be singularized. The person skilled in the art can contemplate other acts to be performed in order to obtain, based on the wafer, one or more chip products.

Figure 3:
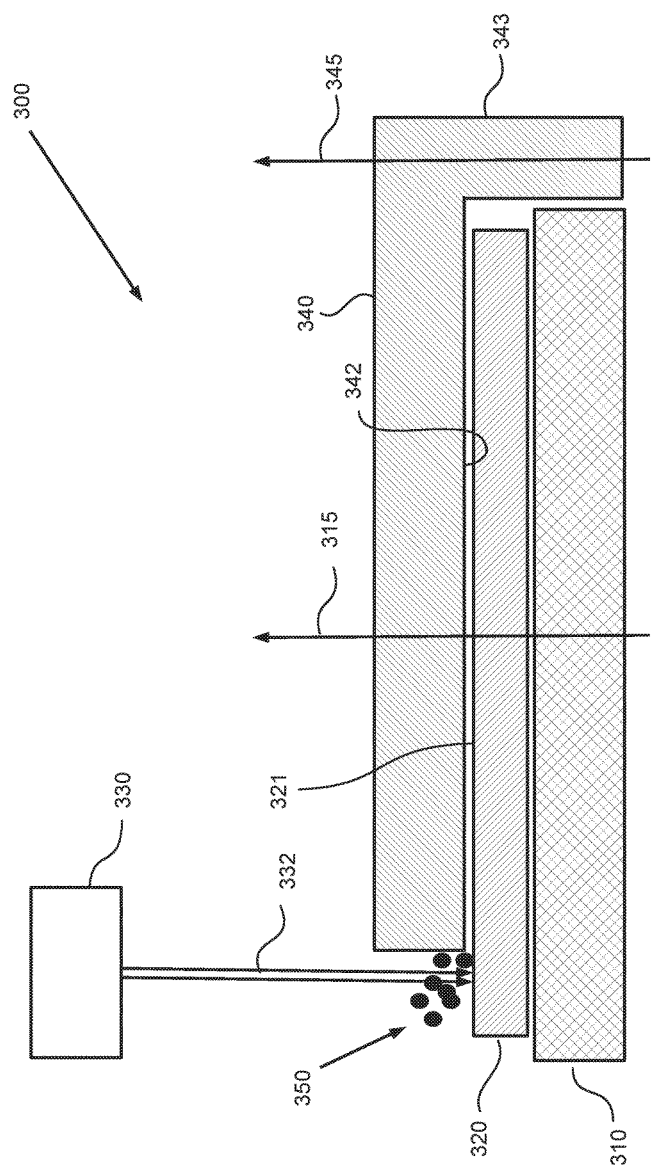
FIG. 3 illustrates a sectional side view of an embodiment of an apparatus for handling a wafer.

FIG. 3 illustrates a sectional side view of an embodiment of an apparatus 300 for handling a wafer 320. The apparatus 300 is configured as a tool for use in manufacturing semiconductor devices or semiconductor device chips. The apparatus 300 is similar to the apparatus 100 illustrated in FIG. 1. In particular, the apparatus 300 includes a support provided as a chuck 310 that is configured to support a workpiece, for example a wafer 320. In some embodiments, chuck 310 includes a turntable having an axis of rotation 315. The apparatus 300 includes a cutting device that, in some embodiments, is provided as a laser tool 330 configured to emit a laser beam 332. The laser beam 332 can be directed onto the wafer 320 so as to cut the wafer 320. Further, in accordance with the various embodiments disclosed herein, apparatus 300 includes a masking device 340 provided as a cover plate 340 that is configured to cover at least a portion of wafer 320.

In many aspects, apparatus 300 resembles the apparatus 100 described above with reference to FIG. 1. Therefore, many features of the apparatus 300 and possible variants thereof are not described again. It should be understood that the skilled person can implement these details, for example, in order to realize the effects associated with the features as described above.

Apparatus 300 differs from the apparatus 100 illustrated in FIG. 1 in that the cover plate 340 is supported on a swivel axle 343 that is located on a side of chuck 310. The cover plate 340 and the swivel axle 343 are configured to enable the cover plate 340 to be pivoted from a side into a position where cover plate 340 covers wafer 320. In particular, the cover plate 340 can cover a central portion of wafer 320. A distance of face 342 of cover plate 340 to a surface 321 of wafer 320 can be kept sufficiently small to reduce the likelihood of impurity particles 350 from entering a space between wafer 320 and cover plate 340 that is formed when operating the laser beam 332 to cut wafer 320.

Use of an apparatus as described above with reference to FIG. 3, can be similar to the exemplary embodiments described with respect to the flow chart illustrated in FIG. 2. Therefore, steps performed in such embodiments need not be described again. In the embodiment illustrated in FIG. 3, cover plate 340 is provided above the central portion of wafer 320 by pivoting cover plate 340 on the swivel axle 343 about the swivel axis 345 into a cover position (as shown in FIG. 3).

It should be understood that the positions and shapes described herein, meanwhile, are merely to state an example. For example, the shape of the wafer need not be essentially circular. Instead, the wafer could have a rectangular shape or an arbitrary shape that does not correspond to any simple geometrical shape such as rectangle, triangle and circle. The support need not receive the wafer coaxially, i.e., with a position of a center such as a 'weight' center of the wafer to coincide with the axis of rotation of the turntable of the chuck.

The embodiments herein are described in terms of exemplary embodiments. It is to be understood that the features of the various embodiments described herein may be combined with each other, unless specifically noted otherwise. In some instances, well-known features are omitted or simplified to clarify the description of the exemplary embodiments. While a particular feature of the disclosure may have been disclosed with respect to only one of several embodiments, such feature may be combined with one or more other features of the other embodiments as may be desired and advantageous for any given or particular application.

Other permutations and combinations of the above-disclosed concepts, method steps and acts are also contemplated as falling within the scope of the disclosure. The disclosure includes all such modifications and alterations and is limited only by the scope of the following claims. In particular having regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the disclosure.

It is intended that this invention be limited only by the claims and the equivalents thereof.

In the above description of exemplary embodiments, for purposes of explanation, specific numbers, materials configurations, and other details are set forth in order to better explain the invention, as claimed. However, it will be apparent to one skilled in the art that the claimed invention may be practiced using different details than the exemplary ones described herein.

The inventors intend the described exemplary embodiments/embodiments to be primarily examples. The inventors do not intend these exemplary embodiments/implementations to limit the scope of the appended claims. Rather, the inventors have contemplated that the claimed invention might also be embodied and implemented in other ways, in conjunction with other present or future technologies.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, the term or is intended to mean an inclusive or rather than an exclusive 'or.' That is, unless specified otherwise or clear from context, 'X employs A or B' is intended to mean any of the natural inclusive permutations. That is, if X employs A; X employs B; or X employs both A and B, then 'X employs A or B' is satisfied under any of the foregoing instances.

As used herein, the articles 'a' and 'an' should generally be construed to mean 'one or more,' unless specified otherwise or clear from context to be directed to a singular form.

The order in which the embodiments/implementations and methods/processes are described is not intended to be construed as a limitation, and any number of the described embodiments and processes may be combined.

As used herein, the terms 'coupled' and 'connected' may have been used to describe how various elements interface.

Unless expressly stated or at least implied otherwise, such described interfacing of various elements may be either direct or indirect.

As used herein, the terms 'having', 'containing', 'including', 'with' or variants thereof, and like terms are open ended terms intended to be inclusive. These terms indicate the presence of stated elements or features, but do not preclude additional elements or features.

As used herein, directional terminology, such as 'top', 'bottom', 'front', back, 'leading', 'trailing', etc., is used with reference to the orientation of the figure(s) being described.

As used herein, terms such as 'first', 'second', and the like, are also used to describe various elements, regions, sections, etc. and are also not intended to be limiting. Although specific embodiments have been illustrated and described herein, it will be appreciated by those of ordinary skill in the art that a variety of alternate and/or equivalent embodiments may be substituted for the specific embodiments shown and described without departing from the scope of the present invention. This application is intended to cover any adaptations or variations of the specific embodiments discussed herein.

The invention claimed is:

1. A method, comprising:
providing a wafer on a support;
covering a central wafer portion of the wafer by setting a masking device over the central wafer portion of the wafer and leaving a space between a surface of the wafer at the central wafer portion of the wafer and the masking device;
pressurizing the space between the surface of the wafer at the central wafer portion of the wafer and the masking device; and
cutting a marginal wafer portion of the wafer from the wafer.

2. The method of claim 1, wherein the central wafer portion of the wafer has a homogeneous thickness.

3. The method of claim 2, wherein a thickness of the marginal wafer portion of the wafer is greater than a thickness of the central wafer portion of the wafer.

4. The method of claim 3, wherein a contour of the masking device follows a circumferential contour of a step formed where the central wafer portion of the wafer abuts the marginal wafer portion of the wafer.

5. The method of claim 1, wherein a stiffness of the masking device is greater than a stiffness of the central wafer portion of the wafer.

6. The method of claim 1, wherein the masking device comprises a plate formed from a material selected from a group of materials consisting of metal, plastic and any combination or derivative of these materials.

7. The method of claim 1, wherein the masking device comprises an opening that is configured as a duct for a gas, and wherein pressurizing the space between the surface of the wafer at the central wafer portion of the wafer and the masking device comprises providing the gas through the opening and into the space between the surface of the wafer at the central wafer portion of the wafer and the masking device.

8. The method of claim 1, wherein setting the masking device over the central wafer portion of the wafer comprises setting the masking device onto a surface of the wafer at the central wafer portion of the wafer.

9. The method of claim 1, wherein cutting the marginal wafer portion of the wafer from the wafer comprises cutting the marginal wafer portion with a laser beam.

10. An apparatus, comprising:
a support configured to support a wafer;
a masking device configured to cover a central wafer portion of the wafer, wherein the masking device is spaced apart from a surface of the wafer at the central wafer portion of the wafer, and wherein the masking device includes a duct configured to direct a gas into a space between the masking device and the surface of the wafer at the central wafer portion of the wafer; and
a cutting device configured to cut a marginal wafer portion of the wafer from the wafer.

11. The apparatus of claim 10, wherein the masking device has a stiffness that is greater than a stiffness of the wafer.

12. The apparatus of claim 11, wherein the masking device comprises a metal plate.

13. The apparatus of claim 11, wherein the masking device is configured to have a contour that follows a circumferential contour of a step formed where the central wafer portion of the wafer abuts the marginal wafer portion of the wafer, wherein the central wafer portion of the wafer is thinner than the marginal wafer portion of the wafer.

14. The apparatus of claim 11, wherein the masking device comprises a duct configured to direct a fluid into a space between the masking device and a surface of the wafer at the central wafer portion of the wafer.

15. The apparatus of claim 10, wherein the cutting device comprises a laser.

* * * * *